United States Patent
Bauer et al.

(10) Patent No.: US 7,728,053 B2
(45) Date of Patent: Jun. 1, 2010

(54) PLASTIC HOUSING COMPOSITION FOR EMBEDDING SEMICONDUCTOR DEVICES IN A PLASTIC HOUSING AND USE OF THE PLASTIC HOUSING COMPOSITION

(75) Inventors: Michael Bauer, Nittendorf (DE); Alfred Haimerl, Sinzing (DE); Angela Kessler, Regensburg (DE); Joachim Mahler, Regensburg (DE); Wolfgang Schober, Amberg (DE)

(73) Assignee: Infineon Technologies, AG, Neubiberg (DE)

( * ) Notice: Subject to any disclaimer, the term of this patent is extended or adjusted under 35 U.S.C. 154(b) by 866 days.

(21) Appl. No.: 11/511,518

(22) Filed: Aug. 29, 2006

(65) Prior Publication Data
US 2007/0054530 A1 Mar. 8, 2007

(30) Foreign Application Priority Data
Sep. 2, 2005 (DE) .................. 10 2005 042 035

(51) Int. Cl.
*C08K 9/00* (2006.01)
(52) U.S. Cl. .................. 523/205; 523/207; 523/211
(58) Field of Classification Search .............. 523/205, 523/207, 211
See application file for complete search history.

(56) References Cited

U.S. PATENT DOCUMENTS

| 4,092,376 | A | 5/1978 | Douek et al. |
| 6,410,615 | B1 * | 6/2002 | Taniguchi et al. ........... 523/211 |

FOREIGN PATENT DOCUMENTS

| DE | 10 2004 044 603 A1 | 3/2006 |
| EP | 0 873 369 B1 | 9/2002 |
| JP | 61031482 A | 7/1984 |
| JP | 2003 253236 A | 9/2003 |

* cited by examiner

*Primary Examiner*—Edward J Cain
(74) *Attorney, Agent, or Firm*—Edell, Shapiro & Finnan, LLC

(57) ABSTRACT

A plastic housing composition for embedding semiconductor devices in a plastic housing includes a multicomponent plastic material, where at least one component is distributed in the plastic material in drop-shaped and/or spherical units. The drop-shaped and/or spherical units are surrounded by dimensionally stable sheaths made from a plastic sheath material. The multicomponent plastic further includes a reactive curing system that cures when the plastic sheaths are torn open. The dimensionally stable plastic sheath material is deformation-sensitive, so that the sheaths tear open under mechanical deformation loading, which initiates and/or accelerates the curing process.

14 Claims, 2 Drawing Sheets

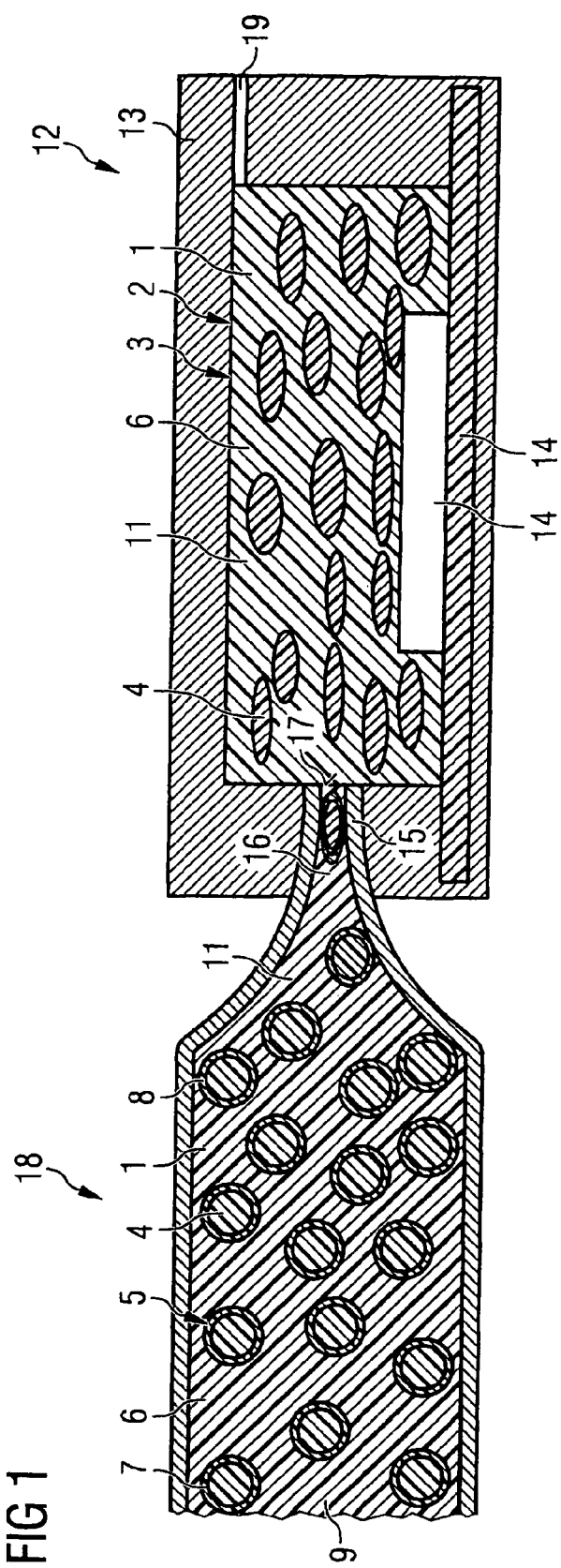

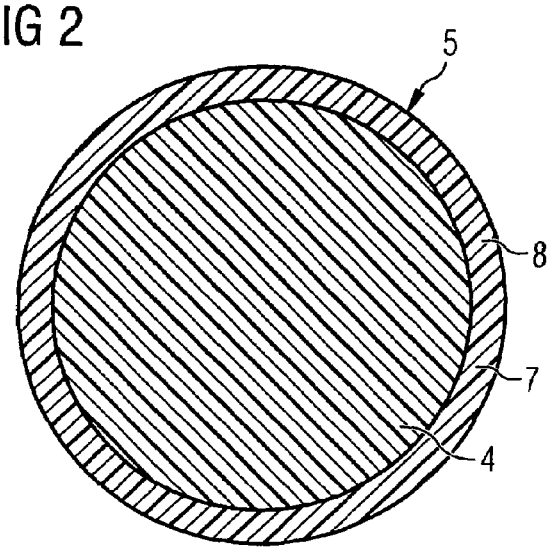
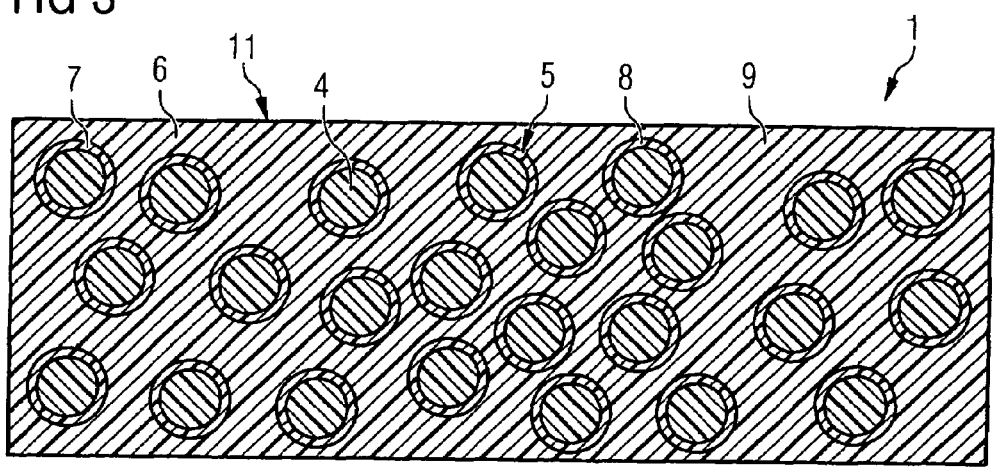

PLASTIC HOUSING COMPOSITION FOR EMBEDDING SEMICONDUCTOR DEVICES IN A PLASTIC HOUSING AND USE OF THE PLASTIC HOUSING COMPOSITION

CROSS REFERENCE TO RELATED APPLICATIONS

This application claims priority under 35 USC §119 to German Application No. DE 10 2005 042 035.4, filed on Sep. 2, 2005, and titled "Plastic Housing Composition for Embedding Semiconductor Devices in an Plastic Housing and Use of the Plastic Housing Composition" the entire contents of which are hereby incorporated by reference.

FIELD OF THE INVENTION

The invention relates to a plastic housing composition for embedding semiconductor devices in a plastic housing and to a method of using the plastic housing composition.

BACKGROUND

A multicomponent plastic in which at least one component is arranged in a manner distributed in spherical form in the volume of the remaining components and is enclosed by a dimensionally stable sheath or capsule is described in German Patent Application No. DE 10 2004 044 603.2. However, the multicomponent plastic used therein is not used as a plastic housing composition, but rather as an underfill material in the region of surface-mountable external contacts and in the form of solder balls which are intended to be applied to a customized circuit board. The curing agent of the two-component plastic for the underfill material is accommodated in capsules, the sheath of which has a thermoplastic which is intended to release the curing agent only when at least the solder temperature for soldering the surface-mountable external contacts onto the customized circuit board has been attained.

The use of such a two-component plastic having a curing agent enclosed in a thermoplastic sheath as a plastic housing composition has the disadvantage that at least the softening temperature of the thermoplastic of the capsule has to be reached for release of the curing agent.

For a plastic housing composition, there is the disadvantage that, after the emergence of the curing agent at the softening temperature of the capsules and the curing of the plastic housing composition to form a plastic housing, the plastic housing composition is then hot and, consequently, the plastic housing has to be cooled to room temperature. Due to the high coefficient of thermal expansion, the plastic housing shrinks and brings about warping, for example, of a circuit substrate on which a semiconductor chip is mounted. Such warping can render the semiconductor housings that are to be formed unusable if the warping exceeds permissible tolerances. In particular, if a plurality of semiconductor houses are intended to be formed simultaneously on a panel, the extreme shrinkage of a plastic housing composition preheated in this manner is problematic for further processing, in particular singulation to form individual housings of the panel due to the incipient warping.

Therefore, there is a need to create a plastic housing composition which exhibits a reduction of a shrinkage effect and hence of warping of semiconductor devices.

SUMMARY OF THE INVENTION

The present invention provides a plastic housing composition and its processing to form plastic housings where a multicomponent plastic is used as a housing composition and without the requirement of thermal softening of protective sheaths.

In accordance with the present invention, a plastic housing composition is provided for embedding semiconductor devices in a plastic housing. The plastic housing composition comprises a multicomponent plastic, at least one component of which is arranged in a manner distributed in drop-shaped and/or spherical form in the volume of the remaining components. The multicomponent plastic comprises a reactively curing system and the component distributed in the drop-shaped and/or spherical form includes a dimensionally stable sheath made from a plastic sheath material, so that the reactive curing commences when the plastic sheath material tears open. The plastic sheath material of the dimensionally stable sheath is dissolution-resistant with respect to the components of the plastic housing composition and it is additionally deformation-sensitive, so that the plastic sheath tears open under mechanical deformation loading.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

BRIEF DESCRIPTION OF THE DRAWINGS

FIG. 1 is a schematic cross-sectional side view of an apparatus utilizing the plastic housing composition for producing a plastic housing in accordance with the invention.

FIG. 2 is a schematic cross-sectional view of a component of a reactively curing system in accordance with the invention, where the component is encapsulated in a dimensionally stable plastic sheath.

FIG. 3 is a schematic cross-sectional side view of a plastic housing composition in accordance with the invention.

DETAILED DESCRIPTION

A plastic housing composition is provided in accordance with the invention, where the plastic housing composition is used for embedding semiconductor devices in a plastic housing. The plastic housing composition includes a multicomponent plastic, at least one component of which is arranged in a manner distributed in drop-shaped and/or spherical form in the volume of the remaining components. The multicomponent plastic comprises a reactively curing system and the component distributed in the drop-shaped and/or spherical form includes a dimensionally stable sheath made from a plastic sheath material, so that the reactive curing commences when the plastic sheath material tears open. The plastic sheath material of the dimensionally stable sheath is dissolution-resistant with respect to the components of the plastic housing composition and it is additionally deformation-sensitive, so that the plastic sheath tears open under mechanical deformation loading.

The plastic housing composition of the invention provides at least the advantage of the reactive curing process being initiated at the instant when the plastic sheath tears open as result of extreme deformation loading on the plastic sheath, and the plastic sheath releases the enclosed component of the multicomponent plastic. Consequently, it is no longer necessary for a thermoplastic plastic sheath to be heated to an extent such that it softens in order to release a component required for the curing process. Rather, the deformation loading can be increased by directional, nonuniform compressive loading of the plastic sheaths to an extent such that the plastic sheath tears open and the reactive curing process commences without extreme heating of the plastic housing composition.

The reactively curing system preferably includes an amine-based curing system. Amine-based curing systems provide at least the advantage that the curing process can take place at temperatures as low as ambient or room temperature and only slight heating due to the heat of reaction of the exothermic process. However, such heating is in no way comparable with the extreme heating associated with the underfill composition such as is known from the above patent application. Moreover, the slight heat of reaction can be dissipated by suitable cooling measures, so that after the completion of the plastic housing, the plastic housing composition is not subjected to extreme shrinkage, in contrast to conventional plastic housing compositions. This means that the problem of warping, for example of a panel having a plurality of semiconductor housings arranged in rows and columns, has also been overcome.

In one preferred embodiment of the invention, the component enclosed by plastic sheath material includes a catalyst material of the reactively curing system. Exemplary catalyst materials, such as e.g. Lewis acids, enable the curing process of multicomponent plastic compositions to commence at room temperature. As long, therefore, as a catalyst material of the reactively curing system is enclosed in the plastic sheaths, curing cannot take place at room temperature. It is only at the instant at which the plastic sheaths tear open as a result of the corresponding deformation loading that the curing process commences on account of the released catalyst material.

A further embodiment of the invention provides for the component enclosed by plastic sheath material to have a curing agent of the reactively curing system. Instead of the catalyst material mentioned above, the curing agent may also initially be taken from the multicomponent plastic in which it is enclosed in a dimensionally stable, but deformation-sensitive sheath. It is only when the curing agent has been released by a corresponding deformation loading that the curing process can then commence.

In a further embodiment of the invention, both the curing agent and the catalyst are enclosed in the plastic sheath material, especially as the curing process cannot commence without these two components.

In a further variant, the plastic housing composition has a resin material enclosed by the plastic sheath material, while the curing agent and the catalyst are present outside the sheath. Such a variant of the plastic housing composition has the advantage that a relatively large volume is accommodated in the dimensionally stable plastic sheath with the resin material, and, consequently, the tearing open of said sheath by corresponding deformation loading can also be carried out more easily.

Furthermore, it is possible for the component enclosed by plastic sheath material to have a resin material and a catalyst material of the reactively curing system. Since the catalyst material, together with the resin material, cannot achieve the crosslinking and lengthening of the molecular chains alone, both components can be accommodated in the plastic sheaths.

In addition to the components accommodated in the plastic sheaths, in a further preferred constitution of the plastic housing composition, the latter has filler particles, the filler proportion being up to 80% by volume of the plastic housing composition. Filler particles of this type can adapt the coefficient of expansion of the plastic housing material, depending on the degree of filling, to corresponding circuit carriers of the semiconductor device that is to be provided with a plastic housing composition. In this case, said filler particles serve to compensate for thermal stresses during later operation of the semiconductor devices and are not directly involved in the solution of the problem area presented here. Specifically, this invention involves avoiding extreme heating of a plastic housing composition when embedding parts of a semiconductor device in the plastic housing composition, in order to reduce the shrinkage effect when the plastic housing composition is cooled to room temperature, and in order not to bring about any warping.

An apparatus for use of the plastic housing composition includes a mold with a cavity that predefines the contour of the plastic housing. Moreover, the parts to be embedded including at least one semiconductor device may be arranged in the mold. Alongside the mold, the apparatus includes an injection or dispensing nozzle, through which the plastic housing composition is fed to the cavity of the mold. For this purpose, the nozzle includes passages for the plastic housing composition, the cross-sectional area of which is smaller than the cross-sectional area of the drop-shaped and/or spherical plastic sheaths.

By virtue of the shaping of the passages in the injection or dispensing nozzle, it is possible to apply such a deformation loading to the plastic sheath of the plastic housing composition that the plastic sheaths tear open mechanically and release the component of the multicomponent plastic of a reactively curing system that is sheathed therein. Consequently, the curing process commences directly after passage through the injection or dispensing nozzle for the reactively curing system.

In one preferred embodiment of the invention, the passages include the meshes of a screen which are arranged upstream of the nozzle outlet and through which the plastic sheaths with the plastic housing composition are pressed prior to emerging from the nozzle. A mesh screen of this type makes it possible to match the through part of a nozzle to the demand for plastic housing composition for filling the cavity of the mold. In a further embodiment of the apparatus, the passages include passage holes which are arranged upstream of the nozzle outlet and through which the plastic sheaths with the plastic housing composition are pressed prior to emerging from the nozzle. In this embodiment, the passage holes have a smaller cross-section than the plastic sheaths in which one of the component of the multicomponent plastic system is incorporated. The passage holes are preferably designed to be narrow enough to exert sufficient deformation loading on the plastic sheaths, so that the latter tear open and release their contents.

A method for producing at least one plastic housing using the plastic housing composition includes the following method steps. The first step involves mixing a plastic housing composition made from a multicomponent plastic, at least one component of which in drop-shaped and/or spherical form is surrounded by a dimensionally stable deformation-sensitive plastic sheath made from a plastic sheath material, the dimensionally stable plastic sheaths being distributed uniformly in the volume of the remaining components of the multicomponent plastic during mixing.

This is followed by pressing the plastic housing composition through passages in an injection or dispensing nozzle of a corresponding apparatus for producing plastic housings. In this embodiment, the cross-sectional areas of the passages are smaller than the cross-sectional areas of the plastic sheaths of the plastic housing composition, so that the plastic sheaths tear open under the mechanical deformation loading that occurs and their contents mix with the surrounding components of the multicomponent plastic. Virtually at the same time, the reactively curing system of the multicomponent plastic is injected or dispensed into a mold, which has the contours of the plastic housing and in which are arranged the parts to be embedded of a semiconductor device.

The plastic housing composition can then be cured at room temperature to form a plastic housing for at least one semiconductor device in the cavity of the mold without the plastic being heated to extremely high temperatures beforehand. This provides at least one significant advantage over previous methods for producing plastic housings for semiconductor devices, since shrinkage of the plastic housing composition after the producing of the semiconductor housing does not occur. Independently of this, in one preferred exemplary implementation of the method, filler particles may be added during mixing of the multicomponent plastic.

In a further preferred exemplary implementation of the method, the components are cooled prior to mixing and/or during mixing. This cooling has the advantage that the heat of reaction during curing can only heat the plastic housing composition to ambient or room temperature (e.g., about 20-25° C.) since the mixture is fed to the injection or dispensing nozzles in correspondingly precooled fashion.

Preferably, it is also possible for excessive heat of reaction to be dissipated by cooling the mold, so that the heat of reaction during curing of the molding advantageously does not rise beyond ambient or room temperature.

To summarize, it can be stated that, according to the invention, a compound required for the reaction, such as a catalyst or a curing agent, for example, is added in the form of a deformation-sensitive capsule to a reactively curing system comprising a plurality of components. This component is then released by applying a pressure gradient and by destroying the sheath or capsule. It is only as a result of the release that the reaction can then take place and the material can cure. The use of amine-based curing systems is particularly advantageous in this case since these systems already cure at room temperature given a suitable choice. This provides a number of advantages including, without limitation, the following:

1. no thermally induced flexure since the curing takes place at room temperature;
2. significantly reduced stress;
3. extremely low heat influence since only heat of reaction that possibly occurs is released, and
4. no thermal shrinkage since the completed plastic housing is not cooled down.

Exemplary embodiments of the invention are now described with reference to the figures.

FIG. 1 shows a basic schematic diagram of an apparatus 12 utilizing a plastic housing composition 1 for producing a plastic housing 3. For the plastic housing 3, the apparatus 12 includes a mold 13 with a cavity that forms the contour of the plastic housing 3. The parts 14 to be embedded of at least one semiconductor device 2 are arranged in the cavity. A premixed plastic housing composition 1 is kept ready in a supply device 18, such as an extruder in the case of injection-molding apparatus or a supply container for dispensing techniques.

This plastic housing composition 1, in which the parts 14 of the semiconductor 3 are to be embedded in the cavity of the mold 13, includes a multicomponent plastic 9 of a reactively curing system 11, one component 4 of the multicomponent plastic 9 being enclosed in a dimensionally stable plastic sheath 7 made from a plastic sheath material 8. The component 4 is distributed uniformly in the volume of the multicomponent plastic 9 in the supply device 18. The supply device 18 is connected to the cavity of the mold 13 via an injection or dispensing nozzle 15. The injection or dispensing nozzle 15 includes a nozzle passage 16, the cross-section of which is smaller than the cross-section of the spherical and/or drop-shaped dimensionally stable sheath 7 in which a component 4 of the components 6 of the multicomponent plastic 9 is embedded.

When such spherical or drop-shaped sheaths 7 are pressed through the narrower cross-section of the nozzle passage 16, the deformation-sensitive dimensionally stable sheaths 7 made from a plastic sheath material 8 are exposed to mechanical deformation loading such that they tear open and release the component 4 at the nozzle outlet 17. The reactive curing process can thus commence in the cavity of the mold 13. During the injection or dispensing of the plastic housing composition 1 into the cavity of the mold 13, the volume of the cavity is vented via ventilation opening 19 to an extent such that no shrink holes and other air inclusions form in the plastic housing 3. In addition, the mold and/or plastic housing composition can be cooled to ensure the composition does not heat beyond room temperature (e.g., about 20-25° C.) during the curing process.

FIG. 2 shows a basic schematic diagram of a component 4 of a reactively curing system, the component 4 being encapsulated in a dimensionally stable plastic sheath 8. The dimensionally stable plastic sheath 8 is deformation-sensitive, however, so that it tears open in the event of mechanical deformation loading and can release the component 4. Such deformation loading may be brought about by a differential pressure that significantly deforms the inherently spherical form 5 of the sheath 8. As already described above, this can be realized by corresponding shaping of the injection nozzle of an apparatus for producing a plastic housing.

A further deformation loading arises when the spherical form is pressed against the outer walls of the cavity since, as a result of this, an isobaric pressure no longer causes loading on the spherical form.

FIG. 3 shows a basic schematic diagram of a plastic housing composition 1 of a multicomponent plastic 9. One of the crucial components 4 of the multicomponent plastic 9 is arranged in a dimensionally stable sheath 8 in a manner distributed uniformly in the volume of the remaining components 6, so that when the sheath 8 breaks open or tears open, the remaining components 6 of the multicomponent plastic 9 of an amine-based reactively curing system can cure.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

| List of reference symbols | |
|---|---|
| 1 | plastic housing composition |
| 2 | semiconductor device |
| 3 | plastic housing |
| 4 | one component of the multicomponent plastic |
| 5 | spherical form of the component |
| 6 | remaining components of the multicomponent plastic |
| 7 | dimensionally stable sheath |
| 8 | plastic sheath material |

-continued

List of reference symbols

| | |
|---|---|
| 9 | multicomponent plastic |
| 11 | reactively curing system |
| 12 | apparatus for the use of the plastic housing composition |
| 13 | mold for molding |
| 14 | parts to be embedded of a semiconductor device |
| 15 | injection or dispensing nozzle |
| 16 | nozzle passage |
| 17 | nozzle outlet |
| 18 | supply device |
| 19 | venting opening |

What is claimed:

1. A plastic housing composition for embedding semiconductor devices in a plastic housing, the plastic housing composition comprising a multicomponent plastic material and including at least a first component distributed throughout the multicomponent plastic material as a plurality of drop-shaped and/or spherical units, each of the drop-shaped and/or spherical units being surrounded by a dimensionally stable plastic sheath so as to isolate the first component from other components in the multicomponent plastic material, and wherein the multicomponent plastic material further comprises a reactive curing system including a second component that reacts with the first component so as to cure the multicomponent plastic material upon the plastic sheath being torn open to expose the first component to the second component, the plastic sheath being dissolution-resistant with respect to each component of the multicomponent plastic material and being deformation-sensitive so as to tear open when subjected to a selected amount of mechanical deformation loading of the plastic sheath; wherein the first component surrounded by the plastic sheath includes a catalyst and a curing agent of the reactively curing system.

2. The plastic housing composition of claim 1, wherein the reactive curing system comprises an amine-based curing system.

3. A plastic housing composition for embedding semiconductor devices in a plastic housing, the plastic housing composition comprising a multicomponent plastic material and including at least a first component distributed throughout the multicomponent plastic material as a plurality of drop-shaped and/or spherical units, each of the drop-shaped and/or spherical units being surrounded by a dimensionally stable plastic sheath so as to isolate the first component from other components in the multicomponent plastic material, and wherein the multicomponent plastic material further comprises a reactive curing system including a second component that reacts with the first component so as to cure the multicomponent plastic material upon the plastic sheath being torn open to expose the first component to the second component, the plastic sheath being dissolution-resistant with respect to each component of the multicomponent plastic material and being deformation-sensitive so as to tear open when subjected to a selected amount of mechanical deformation loading of the plastic sheath, wherein the first component surrounded by the plastic sheath includes a resin material of the reactively curing system.

4. A plastic housing composition for embedding semiconductor devices in a plastic housing, the plastic housing composition comprising a multicomponent plastic material and including at least a first component distributed throughout the multicomponent plastic material as a plurality of drop-shaped and/or spherical units, each of the drop-shaped and/or spherical units being surrounded by a dimensionally stable plastic sheath so as to isolate the first component from other components in the multicomponent plastic material, and wherein the multicomponent plastic material further comprises a reactive curing system including a second component that reacts with the first component so as to cure the multicomponent plastic material upon the plastic sheath being torn open to expose the first component to the second component, the plastic sheath being dissolution-resistant with respect to each component of the multicomponent plastic material and being deformation-sensitive so as to tear open when subjected to a selected amount of mechanical deformation loading of the plastic sheath, wherein the first component surrounded by the plastic sheath includes a resin material and a catalyst material of the reactively curing system.

5. The plastic housing composition of claim 1, wherein the multicomponent plastic material of the plastic housing composition further comprises filler particles, and a proportion of filler particles is in an amount of up to 80% by volume of the plastic housing composition.

6. An apparatus for forming a molded structure comprising:
the plastic housing composition of claim 1;
a mold for the plastic housing;
components of at least one semiconductor device arranged in the mold; and
a nozzle configured to dispense the plastic housing composition within the mold so as to embed the components of the at least one semiconductor device, wherein the nozzle includes at least one passage through which the plastic housing composition is dispensed, and the at least one passage has a cross-sectional dimension that is smaller than a cross-sectional dimension of the drop-shaped and/or spherical units surrounded by plastic sheaths.

7. The apparatus of claim 6, wherein the at least one passage comprises a mesh of a screen that is arranged upstream a nozzle outlet and through which the drop-shaped and/or spherical units surrounded by plastic sheaths are pressed prior to the plastic housing composition emerging from the nozzle.

8. The apparatus of claim 6, wherein the at least one passage includes a passage hole arranged upstream of a nozzle outlet and through which the drop-shaped and/or spherical units surrounded by plastic sheaths are pressed prior to the plastic housing composition emerging from the nozzle.

9. A method for producing at least one plastic housing using a multicomponent plastic housing composition, the method comprising:
forming the multicomponent plastic housing composition by mixing a plurality of components together, the plurality of components including a first component distributed throughout the multicomponent plastic material as a plurality of drop-shaped and/or spherical units, each of the drop-shaped and/or spherical units being surrounded by a plastic sheath so as to isolate the first component from other components in the multicomponent plastic material, and a reactive curing system including a second component that reacts with the first component so as to cure the multicomponent plastic material upon the plastic sheath material being torn open to expose the first component to the second component;
pressing the plastic housing composition through at least one passage of a dispensing nozzle, wherein a cross-sectional area of the at least one passage is smaller than cross-sectional areas of the drop-shaped and/or spherical units surrounded by plastic sheaths, such that the plastic sheaths tear open under mechanical deformation loading as the plastic housing composition is pressed through the at least one passage;

dispensing the multicomponent plastic composition from the dispensing nozzle into a mold, wherein the mold includes contours of the plastic housing and components of at least one semiconductor device to be embedded within the multicomponent plastic composition; and curing the plastic housing composition via reaction of at least the first component with the second component in the mold to form the plastic housing for at least one semiconductor device.

10. The method of claim 9, wherein filler particles are added during the formation of the multicomponent plastic housing composition.

11. The method of claim 9, wherein at least some of the plurality of components of the multicomponent plastic housing composition are cooled prior to mixing and/or during mixing together to from the multicomponent plastic housing composition.

12. The method of claim 9, wherein the mold is cooled during curing of the plastic housing composition to maintain the plastic housing composition at a temperature that is no greater than room temperature.

13. The plastic housing composition of claim 3, wherein the multicomponent plastic material of the plastic housing composition further comprises filler particles, and a proportion of filler particles is in an amount of up to 80% by volume of the plastic housing composition.

14. The plastic housing composition of claim 4, wherein the multicomponent plastic material of the plastic housing composition further comprises filler particles, and a proportion of filler particles is in an amount of up to 80% by volume of the plastic housing composition.

* * * * *